(12) United States Patent
Lu (10) Patent No.: US 9,423,540 B2
(45) Date of Patent: Aug. 23, 2016

(54) METHODS FOR MANUFACTURING GRATING SHEET AND LCD PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Linlin Lu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 120 days.

(21) Appl. No.: 14/528,492

(22) Filed: Oct. 30, 2014

(65) Prior Publication Data

US 2015/0050804 A1    Feb. 19, 2015

Related U.S. Application Data

(62) Division of application No. 13/334,889, filed on Dec. 22, 2011, now Pat. No. 8,902,380.

(30) Foreign Application Priority Data

Dec. 31, 2010 (CN) .......................... 2010 1 0620524

(51) Int. Cl.
    *G02F 1/1333*     (2006.01)
    *G02F 1/1335*     (2006.01)
    (Continued)

(52) U.S. Cl.
    CPC ............ *G02B 5/1847* (2013.01); *G02B 5/1852* (2013.01); *G02B 5/1857* (2013.01);
    (Continued)

(58) Field of Classification Search
    CPC .. H01L 27/1259; H01L 27/124; G02B 5/203; G02B 5/1847–5/1857; G02B 5/201; G02B 5/1814; G02B 5/1866; G02B 27/44; G02B 26/0808; G02B 27/46; G02B 6/2931; G02B 6/29311; G02F 1/1333; G02F 1/133553; G02F 2201/305; G02F 1/133504; G02F 2001/133521; B42D 2035/22
    See application file for complete search history.

(56) References Cited

U.S. PATENT DOCUMENTS

| | | |
|---|---|---|
| 4,246,338 A | 1/1981 | Kaplan |
| 5,162,943 A | 11/1992 | Komatsu et al. |

(Continued)

FOREIGN PATENT DOCUMENTS

| | | |
|---|---|---|
| CN | 1841147 A | 10/2006 |
| CN | 101216631 A | 7/2008 |

(Continued)

OTHER PUBLICATIONS

First Chinese Office Action dated Apr. 3, 2013; Appln. No. 201010620524.2.

(Continued)

*Primary Examiner* — Paul Lee
*Assistant Examiner* — Jia Pan
(74) *Attorney, Agent, or Firm* — Ladas & Parry LLP (57) ABSTRACT

Methods for manufacturing the grating sheet and a liquid crystal display panel are provided. The grating sheet comprises a plurality of primary color gratings in parallel, each of which comprises a red R sub-grating, a green G sub-grating and a blue B sub-grating in parallel, and each sub-grating comprises an opening area and a reflective region disposed around the opening area and corresponds to a pixel unit on a sub-array substrate. The methods for manufacturing the grating sheet and a liquid crystal display panel may be applicable to a system with a liquid crystal display.

9 Claims, 7 Drawing Sheets

(51) Int. Cl.
  *G02B 27/44* (2006.01)
  *G02B 5/18* (2006.01)
  *G02B 5/20* (2006.01)
  *H01L 27/12* (2006.01)

(52) U.S. Cl.
  CPC ............... *G02B 5/201* (2013.01); *G02B 5/203* (2013.01); *G02B 27/44* (2013.01); *G02F 1/1333* (2013.01); *G02F 1/133504* (2013.01); *G02F 1/133514* (2013.01); *H01L 27/124* (2013.01); *H01L 27/1259* (2013.01); *G02F 1/133553* (2013.01); *G02F 2001/133521* (2013.01); *G02F 2201/305* (2013.01)

(56) References Cited

U.S. PATENT DOCUMENTS

| | | | |
|---|---|---|---|
| 5,513,025 | A | 4/1996 | Watanabe et al. |
| 6,304,381 | B1 | 10/2001 | Hayashi |
| 6,490,015 | B1 | 12/2002 | Kim |
| 7,158,302 | B2 * | 1/2007 | Chiu .................. G02B 5/3058 359/485.03 |
| 7,248,310 | B2 | 7/2007 | Mueller-Mach et al. |
| 2003/0059855 | A1 * | 3/2003 | Cunningham ........ B01L 3/5085 435/7.9 |
| 2005/0083460 | A1 | 4/2005 | Hattori et al. |
| 2006/0061862 | A1 | 3/2006 | Mi et al. |
| 2006/0221276 | A1 * | 10/2006 | Masumoto ........ G02F 1/133555 349/114 |
| 2007/0070276 | A1 | 3/2007 | Tan et al. |
| 2008/0238317 | A1 | 10/2008 | Kwon et al. |
| 2009/0046362 | A1 * | 2/2009 | Guo .................. B82Y 40/00 359/485.05 |
| 2009/0246652 | A1 | 10/2009 | Chen et al. |
| 2009/0273744 | A1 | 11/2009 | Wang et al. |
| 2010/0302800 | A1 | 12/2010 | Yang et al. |
| 2010/0309554 | A1 | 12/2010 | Nagai et al. |
| 2011/0285942 | A1 | 11/2011 | Guo et al. |

FOREIGN PATENT DOCUMENTS

| | | |
|---|---|---|
| TW | 200603274 A | 1/2006 |
| TW | 201042301 A | 12/2010 |

OTHER PUBLICATIONS

Second Chinese Office Action dated Nov. 28, 2013; Appln. No. 201010620524.2.

USPTO RR dated May 10, 2013 in connection with U.S. Appl. No. 13/334,889.

USPTO NFOA dated Jul. 2, 2013 in connection with U.S. Appl. No. 13/334,889.

USPTO FOA dated Nov. 8, 2013 in connection with U.S. Appl. No. 13/334,889.

USPTO NFOA dated Apr. 8, 2014 in connection with U.S. Appl. No. 13/334,889.

USPTO NOA mailed Jul. 31, 2014 in connection with U.S. Appl. No. 13/334,889.

* cited by examiner

# METHODS FOR MANUFACTURING GRATING SHEET AND LCD PANEL

This application is a Division of U.S. Ser. No. 13/334,889 filed Dec. 22, 2011, which claims priority from Chinese Patent Application 201010620524.2 filed Dec. 31, 2010.

BACKGROUND

Embodiments of the disclosure relate to a grating sheet, a liquid crystal display (LCD) device, and methods for manufacturing a grating sheet and a LCD panel.

Figure 1:
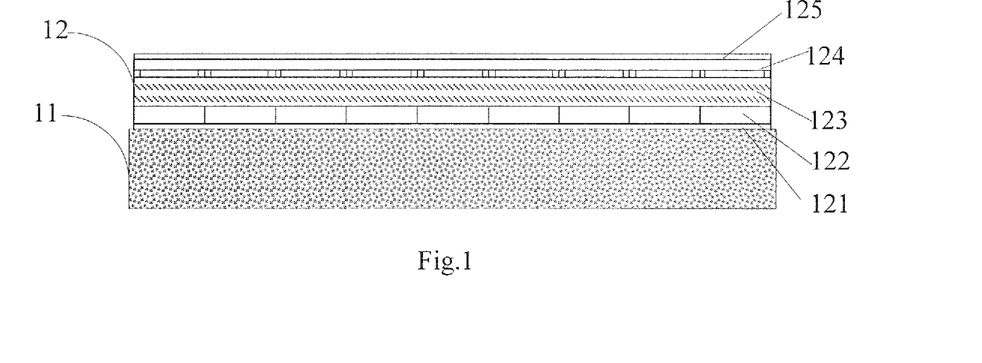
FIG. 1 is a schematic structural view of the LCD device in the related art.

As shown in FIG. 1, an existing LCD device comprises a backlight module 11 and a liquid crystal cell 12, which comprises a lower polarizing film 121, a thin film transistor (TFT) array substrate 122, a liquid crystal layer 123, a color filter substrate 124 and an upper polarizing film 121. A liquid crystal display panel comprises the TFT array substrate 122, the liquid crystal layer 123 and the color filter substrate 124. The backlight module 11 provides a white light source, and the light emitted from the backlight module 11 first passes through the lower polarizing film 121 so as to become polarized light, then sequentially passes through the array substrate 122, the liquid crystal layer 123 and the color filter substrate 124 and becomes R (red), G (green) and B (blue) primary color light using R, G and B sub-pixels on the color filter substrate 124, and finally exits from the upper polarizing film 125. Images may be displayed by controlling orientation angles of the liquid crystal molecules in the liquid crystal layer 123 for transmitting light.

Figure 2:
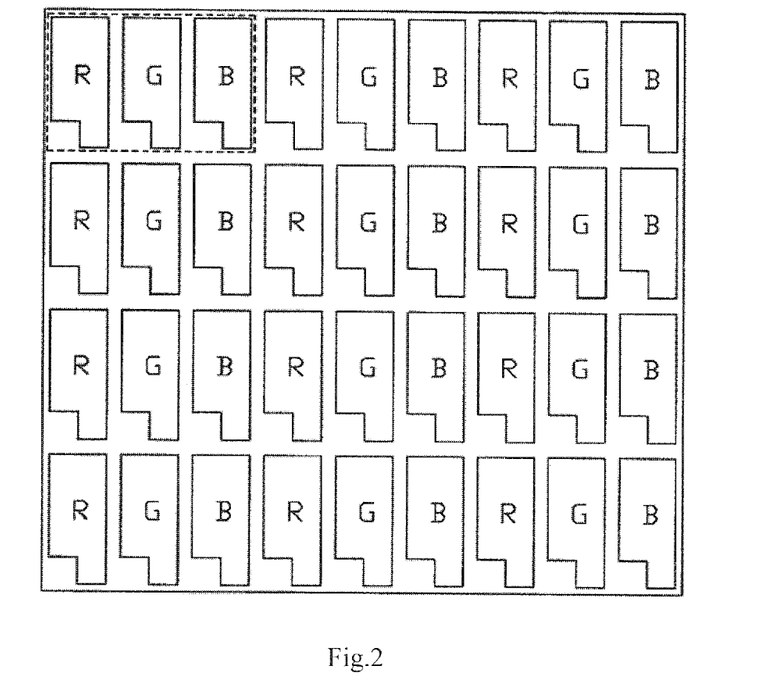
FIG. 2 is a top view of the opposing substrate in the LCD device as shown in FIG. 1.

A conventional LCD device generates the R, G, B primary color light by using the R, G, B sub-pixels on a color filter substrate comprising a plurality of R, G, B sub-pixels disposed parallel with one another and in an array, as shown in FIG. 2. Black matrix regions are formed around opening areas of the R, G, B sub-pixels for blocking light, thus light will be totally absorbed when the light is incident onto the black matrix region, therefore part of light emitted from the backlight module may be wasted so that a utilization ratio of the light is relatively low.

SUMMARY

Embodiments of the present application provide a grating sheet, a LCD device and methods for manufacturing the grating sheet and a liquid crystal display panel, which can prevent part of light emitted from the backlight module from being absorbed by a black matrix and thus wasted so that a utilization ratio of the light is relatively high.

According to an aspect of the disclosure, a grating sheet is provided, which comprises a plurality of primary color gratings disposed parallel with one another, wherein each primary color grating comprises a red (R) sub-grating, a green (G) sub-grating, and a blue (B) sub-grating parallel with one another, and wherein each sub-grating comprises an opening area with a metal layer for diffraction therein and with a reflective region disposed around and corresponds to a pixel unit.

According to an aspect of the disclosure, a liquid crystal display (LCD) device is provided, comprising: a liquid crystal cell, comprising an upper polarizing film, a liquid crystal display panel, and a bottom polarizing film from top to bottom, wherein the liquid crystal display panel comprises an array substrate, an opposing substrate and a liquid crystal layer interposed between the array substrate and the opposing substrate; and the above-described grating sheet, wherein the grating sheet is provided at a light exiting side of the backlight module.

According to an aspect of the disclosure, a method for manufacturing a grating sheet is provided, wherein the method comprises: sequentially depositing a silicon nitride film on a base substrate, forming a red (R) sub-wire grating, a green (G) sub-wire grating and a blue (B) sub-wire grating by a patterning process and then coating a metal film on the base substrate to form a red (R) sub-grating, a green (G) sub-grating and a blue (B) sub-grating parallel with one another; and forming a reflective film on the base substrate, and forming a reflective region around the opening area of each sub-grating by a patterning process.

According to an aspect of the disclosure, a method for manufacturing a liquid crystal display panel is provided, wherein it comprise: forming an opposing substrate with only a transparent conductive film deposited thereon; forming an array substrate on which a data line and a gate line are crosses with each other and define a pixel unit; forming the grating sheet according to embodiments of the disclosure, wherein the grating sheet is formed on a glass substrate, an array substrate or an opposing substrate; attaching the array substrate and the grating sheet or attaching the opposing substrate and the grating sheet when the grating sheet is formed on the glass substrate; and when the grating sheet is formed on the array substrate or the opposing substrate, attaching the array substrate and the opposing substrate.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein:

FIGS. 8(a) to 8(e2) show the process of manufacturing a grating sheet according to still another embodiment of the disclosure.

DETAILED DESCRIPTION

To make objectives, technical solutions and advantages provided by the embodiments of the present disclosure more clearly, a clear and full description will be made to the technical solutions of embodiments of present disclosure hereinafter in connection with the accompanying drawings. Apparently, rather than all the embodiments, embodiments to be described are only a part of embodiments of present disclosure. Based on the embodiments of the present disclosure, other embodiments conceived by those skilled in the art without inventive work would fall within the scope of present disclosure.

Embodiments of the disclosure provides a grating sheet, a liquid crystal display (LCD) device and the method for manufacturing the grating sheet and the liquid crystal display panel to prevent part of light emitted from a backlight module from being absorbed by a black matrix region and thus being wasted, which causes a relatively low utilization ratio.

Figure 3:
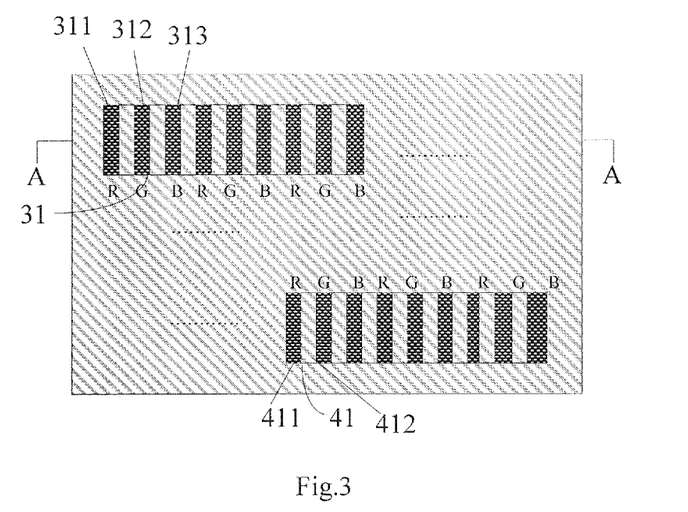
FIG. 3 is a schematic structural view of a grating sheet according to an embodiment of the present disclosure.
Figure 4A:
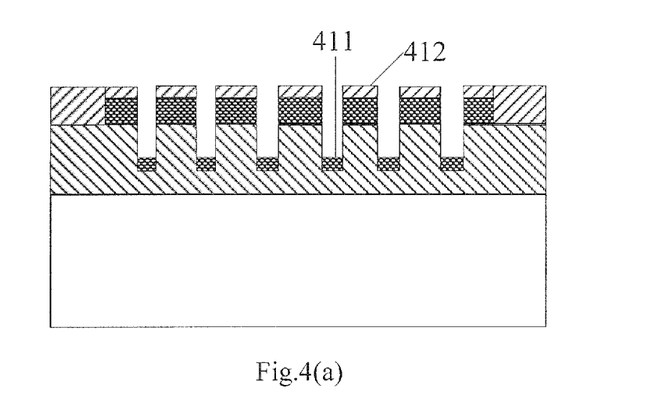
FIG. 4(a) is a first cross-sectional view of the grating sheet as shown in FIG. 3.
Figure 4B:
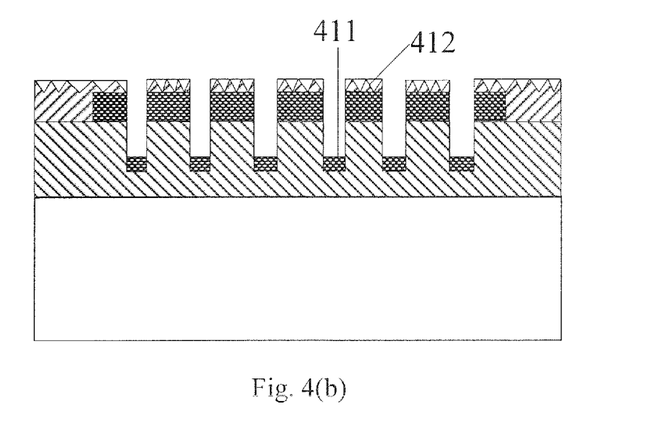
FIG. 4(b) is a second cross-sectional view of the grating sheet as shown in FIG. 3.

As shown in FIG. 3, a grating sheet provided by an embodiment of the disclosure comprises a plurality of primary color grating 31 disposed parallel with one another, and each primary color grating 31 comprises an R (red) sub-grating 311, a G (green) sub-grating 312 and a B (blue)sub-grating 313 disposed parallel with one another. As shown in FIGS. 4(a) to 4(b), each sub-grating 41 comprises an opening area 411 with a lower metal layer for diffraction therein and a reflective region 412 disposed around the opening area 411. An upper metal layer is disposed in the reflective region 412 and a reflective film overlays the upper metal layer. Each of the sub-gratings corresponds to a pixel unit on an array substrate.

In the present embodiment, the reflective region may be a specular (or mirror) type reflective region as shown in FIG. 4(a) or a prism type reflective region as shown in FIG. 4(b). When the reflective region is a prism type reflective region, the reflective film 907 may be a prism type reflective film formed, for example, by stamping the reflective film by a mold with prism patterns. For example, the reflective region is a prism type reflective region such that the light intensity reflected from the reflective region is uniform.

According to the optical principle, gratings with different widths and intervals can be used for selecting light having different wavelengths, that is, for transmitting light having specific wavelengths. The R, G, B primary color light required for the LCD device for display can be accordingly obtained by adjusting the design parameters of grating sheets based on such optical principle. In the present embodiment, the R, G, B primary color light may be selectively transmitted by using sub-gratings having the same period length but different opening area widths, so as to form an R sub-grating, a G sub-grating and a B sub-grating. For example, if the metal layer for diffraction is an aluminum metal layer, the design parameters of the grating sheet may be determined as follows:

R sub-grating: l=0.813 um, Φ=20%, t=80 nm, d=20 nm;
G sub-grating: l=0.813 um, Φ=36%, t=60 nm, d=40 nm;
B sub-grating: l=0.813 um, Φ=47%, t=40 nm, d=60 nm;

wherein "l" is a period length of a sub-grating, "Φ" is a duty cycle and Φ=w/l, "w" is an opening width of a sub-grating opening area, "t" is a thickness of the metal layer for diffraction on the sub-grating, and "d" is an interval between the opening area and the reflective region.

It should be noted that the design of the R, G, B sub-gratings are not limited to the above-described one. In another example, the design may include the same period length, the same duty cycle and different material for forming the metal layer so as to achieve R, G, B sub-gratings, and unnecessary details will not be given here for simplicity. For example, the thickness of the metal layer of the R sub-gratings is in the range of 75~85 nm; the thickness of the metal layer of the G sub-gratings is in the range of 55~65 nm; and the thickness of the metal layer of the B sub-gratings is in the range of 35~45 nm; the material of the metal layers of the sub-gratings may be aluminum, copper, chromium, and the like.

Since the grating sheet provided by embodiment of the disclosure comprises a plurality of parallel disposed primary color gratings comprising an R (red) sub-grating, a G (green) sub-grating and a B (blue) sub-grating, each of which comprises an opening area and a reflective region disposed around the opening area and corresponds to a pixel unit on the array substrate, thereby the grating sheet can display R, G, B colors. Since each sub-grating further comprises a reflective region so that the light emitted from the backlight module and not passing through the grating sheet is reflected from the reflective region back to the backlight module, and further reflected to the grating sheet by the backlight module, thereby the light which does not pass through the grating sheet initially can be utilized again; this configuration can solve the problem that a portion of light emitted from the backlight module is be absorbed by a black matrix region and thus wasted, which causes a relatively low utilization ratio.

Figure 5A:
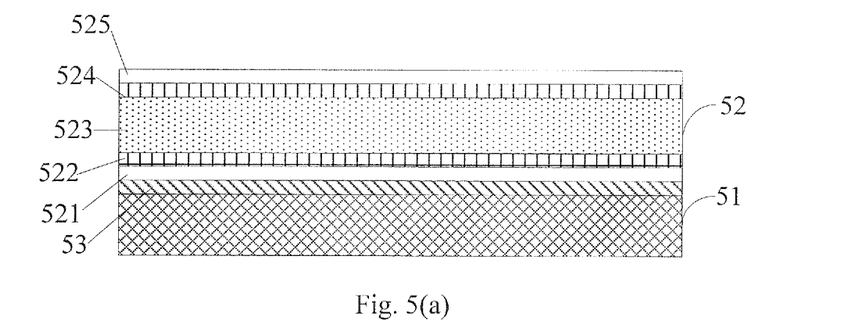
FIG. 5(a) is a schematic structural view of the LCD device according to an embodiment of the disclosure.
Figure 5B:
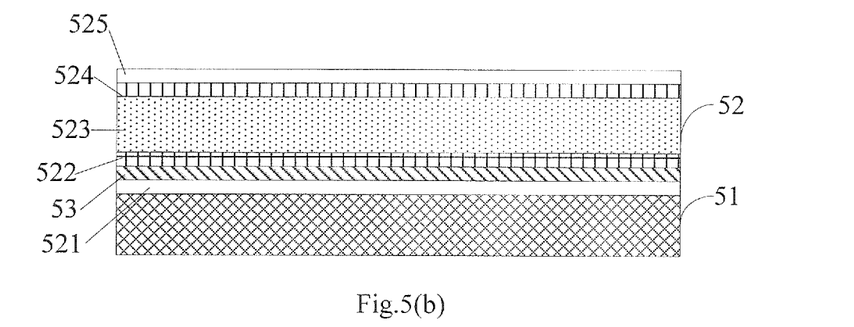
FIG. 5(b) is a schematic structural view of the LCD device according to another embodiment of the disclosure.
Figure 5C:
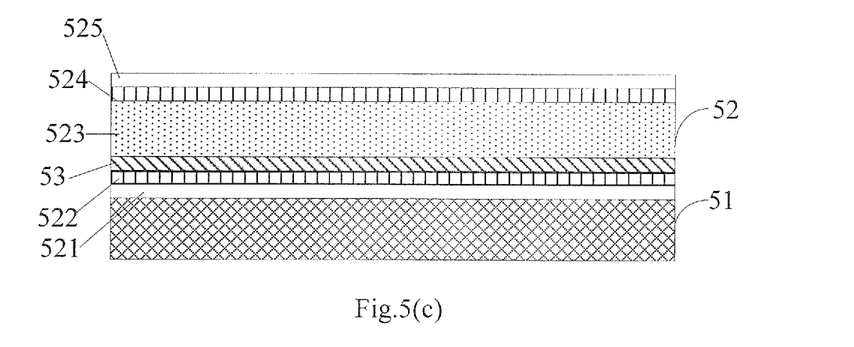
FIG. 5(c) is a schematic structural view of the LCD device according to another embodiment of the disclosure.
Figure 5D:
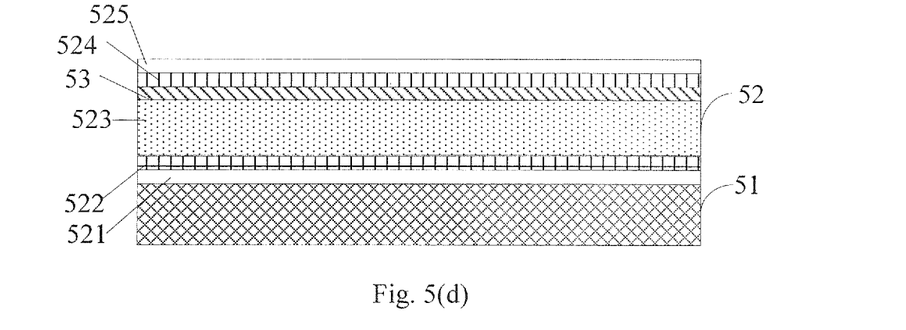
FIG. 5(d) is a schematic structural view of the LCD device according to another embodiment of the disclosure.
Figure 5E:
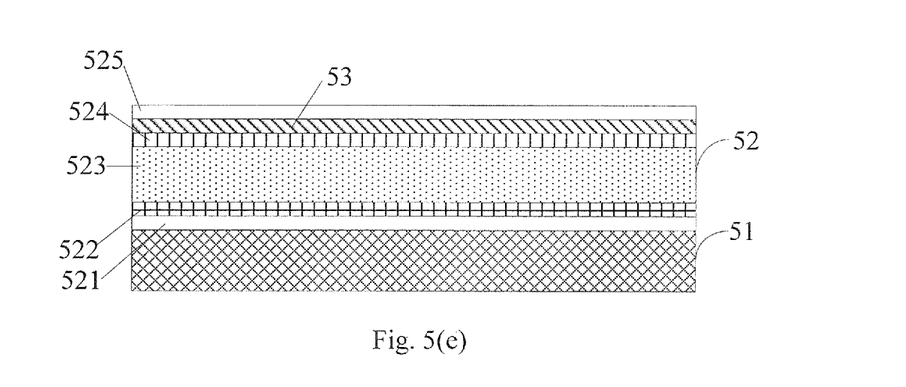
FIG. 5(e) is a schematic structural view of the LCD device according to another embodiment of the disclosure.
Figure 5F:
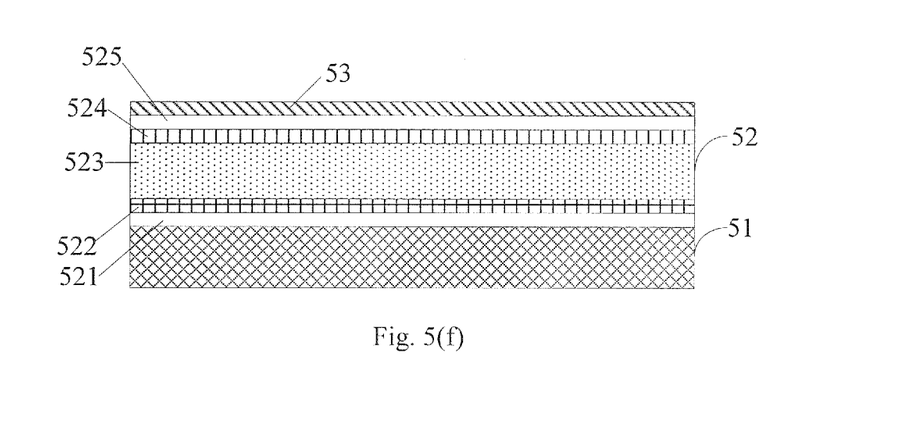
FIG. 5(f) is a schematic structural view of the LCD device according to another embodiment of the disclosure.

As shown in FIGS. 5(a)-5(b), a LCD device provided by an embodiment of the disclosure comprises a backlight module 51 and a liquid crystal cell 52 comprising a lower polarizing film 521, a thin film transistor array substrate 522, a liquid crystal layer 523, an opposing substrate 524 and an upper polarizing film 525. The TFT array substrate 522, the liquid crystal layer 523, and the opposing substrate 524 constitute a liquid crystal display panel; the liquid crystal layer 523 is interposed between the substrates provided opposite to each other. The LCD device further comprises a grating sheet 53 provided by aforesaid embodiment, which is provided at a light exiting side of the backlight module 51.

According to one embodiment of the disclosure as shown in FIG. 5 (a), the grating sheet 53 is provided between the backlight module 51 and the lower polarizing film 521. The backlight module 51 provides a white light source, and light emitted from the backlight module 51 first passes through the grating sheet 53 to obtain R, G, B primary color light, wherein the light which does not pass through the grating sheet 53 is reflected back to the backlight module 1 and then for example a prism film in the backlight module 11 reflects the light, reflected back from the grating sheet 53, to the grating sheet 53 again. The R, G, B primary color light obtained by passing through the grating sheet 53 then passes through the lower polarizing film 521 to be changed into polarized light, then the array substrate 522, the liquid crystal layer 523, and the opposing substrate 524 with only a transparent conductive layer disposed thereon, and finally exits from the upper polarizing film 525. Images can be displayed by controlling orientation angles of the liquid crystal molecules in the liquid crystal layer 523 during transmitting light.

According to another embodiment of the disclosure as shown in FIG. 5 (b), the grating sheet 53 is provided between the lower polarizing film 521 and the liquid crystal display panel. The backlight module 51 provides a white light source, and light emitted from the backlight module 51 first passes through the lower polarizing film 521 to be changed into polarized light, then the polarized light passes through the grating sheet 53 to obtain R, G, B primary color light, wherein the light which does not pass through the grating sheet 53 is reflected back to the backlight module 51 and then for example a prism film in the backlight module 51 reflects the light, reflected back by the grating sheet 53, to the grating sheet 53 again. The R, G, B primary color light obtained by the grating sheet 53 passes through the array substrate 522, the liquid crystal layer 523, and the opposing substrate 524 with only a transparent conductive layer disposed thereon, and finally exits from the upper polarizing film 525. Images can be displayed by controlling orientation angles of the liquid crystal molecules in the liquid crystal layer 523 during transmitting light.

According to another embodiment of the disclosure as shown in FIG. 5 (*c*), the grating sheet 53 is provided between the array substrate 522 and liquid crystal layer 523 of the liquid crystal display panel. The backlight module 51 provides a white light source, and light emitted from the backlight module 51 first passes through the lower polarizing film 521 to be changed into polarized light, and then passes through the array substrate 522, the grating sheet 53, the liquid crystal layer 523 and the opposing substrate 524 to obtain the R, G, B primary color light with the grating sheet 53, wherein the light which does not pass through the grating sheet 53 is reflected back to the backlight module 51 and then for example a prism film in the backlight module 51 reflects the light, reflected back by the grating sheet 53, to the grating sheet 53 again; and the light finally exits from the upper polarizing film 525. Images can be displayed by controlling orientation angles of the liquid crystal molecules in the liquid crystal layer 523 during transmitting light.

According to another embodiment of the disclosure as shown in FIG. 5 (*d*), the grating sheet 53 is provided between the opposing substrate 524 and liquid crystal layer 523 of the liquid crystal display panel. The backlight module 51 provides a white light source, and light emitted from the backlight module 51 first passes through the lower polarizing film 521 to be changed into polarized light, and then passes through the array substrate 522, the liquid crystal layer 523, the polarizing film 53 and the opposing substrate 524 to obtain the R, G, B primary color light with the grating sheet 53, wherein the light which does not pass through the grating sheet 53 is reflected back to the backlight module 51 and then for example a prism film in the backlight module 51 reflects the light, reflected back by the grating sheet 53, to the grating sheet 53 again; and finally exits from the upper polarizing film 525. Images can be displayed by controlling orientation angles of the liquid crystal molecules in the liquid crystal layer 523 during transmitting light.

According to another embodiment of the disclosure as shown in FIG. 5 (*e*), the grating sheet 53 is provided between the liquid crystal display panel and the upper polarizing film 524. The backlight module 51 provides a white light source, and the light emitted from the backlight module 51 first passes through the lower polarizing film 521 to be changed into polarized light, next passes through the array substrate 522, the liquid crystal layer 523, and the opposing substrate 524 with only one transparent conductive layer disposed thereon, and then through the grating sheet 53 to obtain the R, G B primary color light, wherein the light which does not pass through the grating sheet 53 is reflected to the backlight module 11 and for example the prism film in the backlight module 11 reflects the light, reflected back by the grating sheet 53, to the grating sheet 53 again, and then the R, G, B primary color light which is obtained by the grating sheet 53 finally exits from the upper polarizing film 525. Images can be displayed by controlling orientation angles of the liquid crystal molecules in the liquid crystal layer 523 during transmitting light.

According to another embodiment of the disclosure as shown in FIG. 5 (*f*), the grating sheet 53 is provided at the light exiting side of the upper polarizing film 524. The backlight module 51 provides a white light source, and the light emitted from the backlight module 51 firstly passes through the lower polarizing film 521 to be changed into polarized light, then passes through the array substrate 522, the liquid crystal layer 523, and the opposing substrate 524 with only one transparent conductive layer disposed thereon, exits from the upper polarizing film 525, and finally passes through the grating sheet 53 to obtain R, G, B primary color light, wherein the light which does not pass through the grating sheet 53 is reflected to the backlight module 51 and then for example the prism film therein reflects the light, reflected back by the grating sheet 53, to the grating sheet 53 again. Images can be displayed by controlling orientation angles of the liquid crystal molecules in the liquid crystal layer 523 during transmitting light.

Preferably, the grating sheet 53 is disposed between the light incident side of the liquid crystal layer and the light exiting side of the backlight module in the liquid crystal display panel, as shown in FIGS. 5 (*a*)-5(*c*), thereby preventing part of the light emitted from the backlight module from passing through the liquid crystal layer twice to be reflected onto the backlight module, which may cause the light confusion due to the light reversion by the liquid crystal layer.

It should be noted that the above described embodiments are explained by taking the TFT array substrate of the liquid crystal display panel as the light incident side of the liquid crystal display panel as an example; however, it can also be explained by taking the opposing substrate in the liquid crystal display panel as the light incident side of the liquid crystal display panel as an example where the light path is similar to that in the aforesaid embodiments, which will not be described in detail here for simplicity. If the opposing substrate encounters the light emitted from the backlight module before the grating sheet, the opposing substrate is only disposed with a transparent conductive layer.

Figure 6:
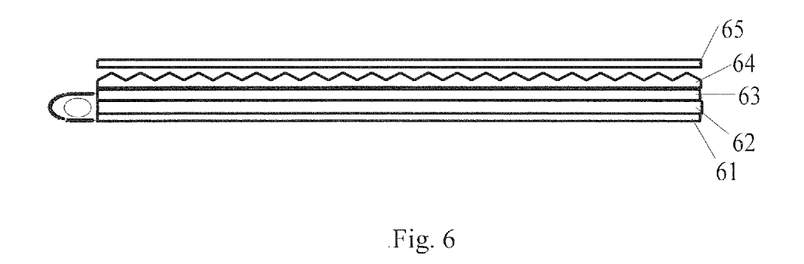
FIG. 6 is a schematic structural view of an exemplary backlight module in the LCD device as shown in FIGS. 5(a) to 5(f).
Figure 7:
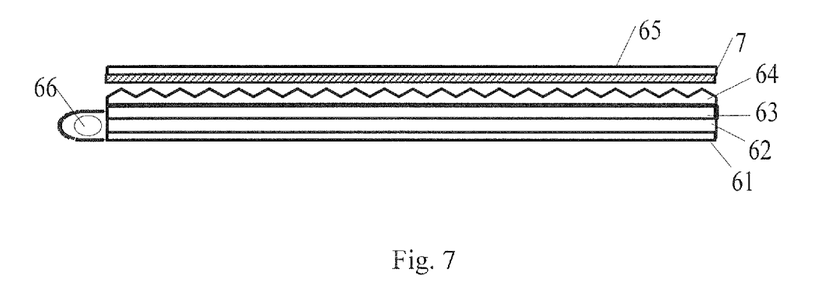
FIG. 7 is a schematic structural view of another exemplary backlight module in the LCD device as shown in FIGS. 5(a) to 5(f).

As shown in FIG. 6, the backlight module comprises a reflective plate 61, a light guide plate 62, a diffuser plate 63, a prism film 64 and a protection film 65 from bottom to top in order; a light source 66 is disposed on a side of the light guide plate 62 or under the light guide plate 62. The light reflected back by the grating sheet may be reflected to the upper grating sheet again by the prism film 64 of the backlight module; however, the reflectivity of the prism film 64 generally is lower than that of the planar mirror. Furthermore, in order that the light reflected from the reflective region may be more effectively utilized again, as shown in FIG. 7, a reflective film 7 may be disposed between then protection film 65 and the prism film 64 of the backlight module. In another example, in order to reduce cost, the light exiting side surface of the protection film 65 of the backlight module in FIG. 6 may be subject to a mirror finish treatment so that the light exiting side surface of the protection film 65 of the backlight module is of a mirror type surface.

According to the LCD device provided by the embodiment of the disclosure, since the grating sheets comprise a plurality of parallel disposed primary color gratings comprising an R (red) sub-grating, a G (green) sub-grating and a B (blue) sub-grating, each of which comprises an opening area and a reflective region disposed around the opening area and corresponds to a pixel unit on the array substrate, thereby the grating sheets can display R, G, B colors. Since each sub-grating further comprises a reflective region so that the light emitted from the backlight module and then not passing through the grating sheet is reflected from the reflective region onto the backlight module, and further reflected to the grating sheet by the backlight module, thus the light which does not pass through the grating sheets initially can be utilized again, preventing part of the light emitted from the backlight module from being absorbed by the black matrix region and thus wasted and causing a low utilization ratio.

A method for manufacturing the grating sheet according to an embodiment of the disclosure comprises the following steps.

Step 801, sequentially depositing a silicon nitride film on a base substrate, forming an R (red) sub-wire grating, a G (green) sub-wire grating, and a B (blue) sub-wire grating by a patterning process and then coating a metallic film on the substrate to form an R (red) sub-grating, a G (green) sub-grating, and a B (blue) sub-grating parallel with one another.

In the present embodiment, the base substrate may be a transparent substrate such as a glass substrate or a plastic substrate, an opposing substrate only with a transparent conductive film deposited thereon, or a finished array substrate. In the present embodiment, the metallic film for diffraction may be an aluminum metallic film which has a high extinction ratio and a high luminous flux, and the design parameters of the grating sheet are as follows:

R sub-grating: l=0.813 um, Φ=20%, t=80 nm, d=20 nm;
G sub-grating: l=0.813 um, Φ=36%, t=60 nm, d=40 nm;
B sub-grating: l=0.813 um, Φ=47%, t=40 nm, d=60 nm;

wherein "l" is a period length of a sub-grating, "Φ" is a duty cycle and 101=w/l, "w" is an opening width of a sub-grating opening area, "t" is a thickness of the metal layer for diffraction on the sub-grating, and "d" is an interval between the opening area and the reflective region.

Step 802, depositing a reflective film on the base substrate, forming a reflective region by a patterning process, wherein the reflective region is disposed around the opening area of each sub-grating.

Another method for manufacturing the grating sheet according to another embodiment of the disclosure comprises the following steps.

As shown in FIG. 8 (*a*), firstly, depositing a silicon nitride film 901 on a base substrate 9 by chemical vapor deposition (CVD) process, and then spinning coating a layer of photoresist 902 on the silicon nitride film 901.

As shown in FIG. 8 (*b*), next, forming a red R sub-wire grating 903 by an exposure, developing and etching process, and then removing the remaining photoresist 902.

As shown in FIG. 8(*c*), then repeating the steps as shown in FIGS. 8(*a*) and 8(*b*) on the base substrate to form a G sub-wire grating 904 and a B sub-wire grating 905 in sequence.

As shown in FIG. 8(*d*), forming an aluminum metal film 906 on the surface of the substrate for example by a magnetron sputtering apparatus to form an R sub-grating 903, a G sub-grating 904 and a B sub-grating 905 parallel with one another. As shown in FIG. 8(*d*), a lower metal layer 906*b* is disposed in the opening area for diffraction, and an upper metal layer 906*a* is disposed in the reflective region around the opening area.

Figure 8:
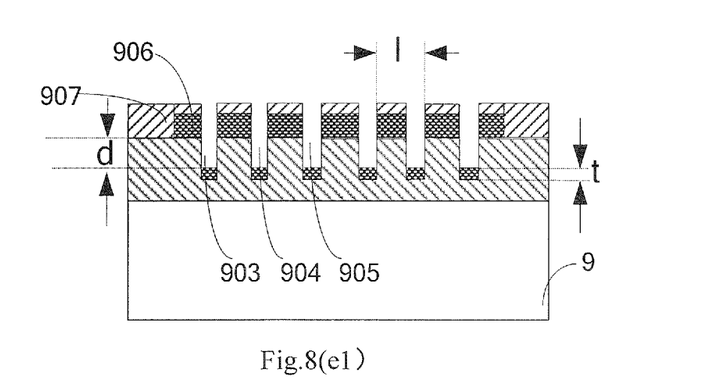
Figure 8A:
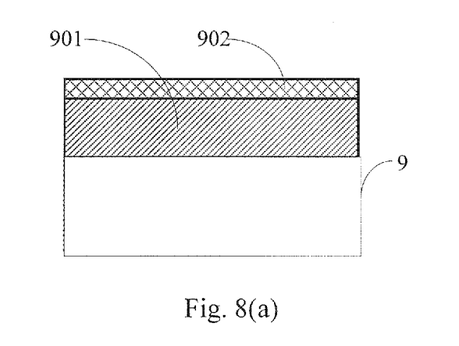
Figure 8B:
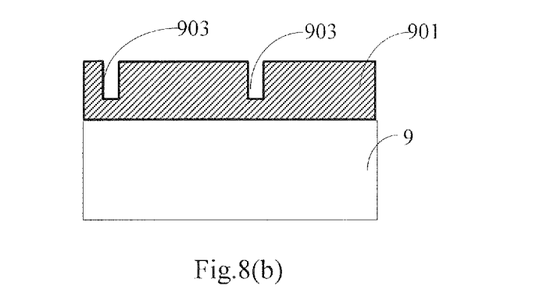
Figure 8C:
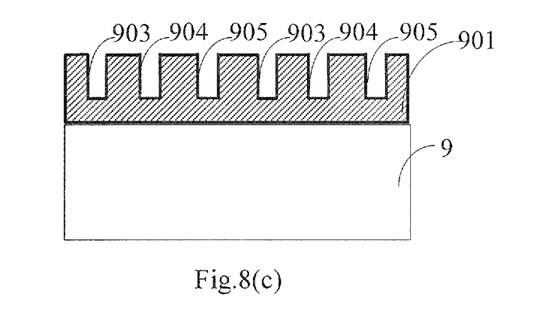
Figure 8D:
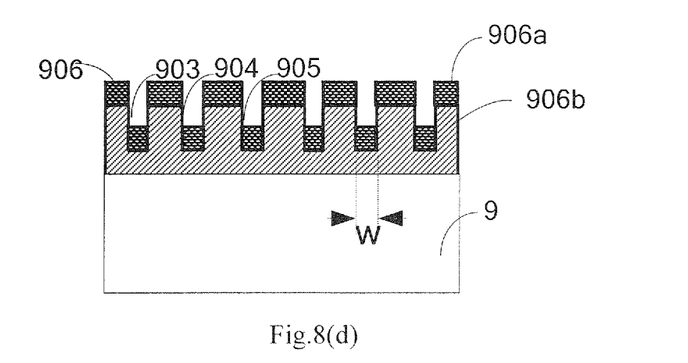

As shown in FIGS. 8(*e*1) and 8(*e*2), finally, depositing a reflective film on the substrate, and then patterning the reflective film so that the reflective film is formed around the opening area of each sub-grating. Thus, the reflective region is the region around the opening area, and the reflective region includes the upper metal layer and the reflective film overlaying the upper metal layer.

Depositing a reflective film on the base substrate by a patterning process as shown in FIG. 8(*e*1) for example comprises the following steps: depositing a reflective film on the substrate; spinning coating a photoresist film on the reflective film; exposing an opening area of each sub-grating by performing an exposure, develop and etching process to the base substrate and then removing the remaining photoresist on the substrate.

Or, depositing a reflective film on the substrate by a patterning process as shown in FIG. 8(*e*2) for example comprises: stamping by using a mold with prism patterns to form a prism type reflective film before spinning coating a photoresist film on the reflective film in addition to the steps as shown in FIG. 8(*e*1). Thus the light intensity reflected from the reflective region is uniform.

It should be noted that the substrate may be a transparent substrate such as a glass substrate or a plastic substrate, an opposing substrate, or an array substrate. If the base substrate is an opposing substrate, the opposing substrate is only with a transparent conductive film deposited thereon. If the base substrate is an array substrate, the method further comprises depositing a transparent conductive film on the array substrate before sequentially depositing the silicon nitride film on the substrate.

According to the grating sheet, the LCD device and the method for manufacturing the grating sheet and the liquid crystal display panel provided by embodiments of the disclosure, since the grating sheet comprise a plurality of parallel disposed primary color gratings comprising an R (red) sub-grating, a G (green) sub-grating and a B (blue) sub-grating, each of which comprises an opening area and a reflective region disposed around the opening area and corresponds to a pixel unit on the array substrate, thereby the grating sheet can display R, G, B colors. Since each sub-grating further comprises a reflective region so that the light emitted from the backlight module and not passing through the grating sheet is reflected from the reflective region onto the backlight module and further reflected to the grating sheet by the backlight module, thereby the light which does not pass through the grating sheet initially can be utilized again, which can solve the problem that part of the light emitted from the backlight module may be absorbed by the black matrix region and thus wasted and causes a low utilization ratio.

A method for manufacturing the liquid crystal display panel according to an embodiment of the disclosure comprises the following steps.

Step 1001, forming an opposing substrate on which only a transparent conductive film is formed.

Step 1002, forming an array substrate, wherein data lines and gate lines are crosses with each other and thus define pixel units on the array substrate.

Step 1003, forming an above-mentioned grating sheet, wherein the grating sheet is formed on a transparent substrate, the array substrate or the opposing substrate.

Step 1004, when the grating sheet is formed on the transparent substrate, attaching together the array substrate and the grating sheet or attaching together the opposing substrate and the grating sheet.

Step 1005, when the grating sheet is formed on the array substrate or the opposing substrate, attaching together the array substrate and the opposing substrate.

According to the method for manufacturing the liquid crystal display panel according to the embodiment of the disclosure, since the grating sheet comprise a plurality of parallel disposed primary color gratings comprising an R (red) sub-grating, a G (green) sub-grating and a B (blue) sub-grating, each of which comprises an opening area and a reflective region disposed around the opening area and corresponds to a pixel unit on the array substrate, thereby the grating sheet can display R, G, B colors. Since each sub-grating further comprises a reflective region, so that the light emitted from the backlight module and not passing through the grating sheet initially is reflected from the reflective region onto the backlight module and further reflected to the grating sheet by the backlight module again, thereby the light which does not pass through the grating sheet initially can be utilized again, which can solve the problem that part of the light emitted from the backlight module may be absorbed by the black matrix region and wasted and causes a relatively low utilization ratio.

The grating sheet, the LCD device and methods for manufacturing the grating sheet, liquid crystal display panel according to embodiments of the disclosure may be applied to a system having a liquid crystal display.

It should be appreciated that the embodiments described above are intended to illustrate but not limit the present disclosure. Although the present disclosure has been described in detail herein with reference to the preferred embodiments, it should be understood by those skilled in the art that the present disclosure can be realized with different material and equipment as necessary, and that various modification and equivalents thereof can be made herein without departing from the spirit and scope of the present disclosure.

What is claimed is:

1. A method for manufacturing a grating sheet, comprising:
   depositing a silicon nitride film on a base substrate, forming a red (R) sub-wire grating, a green (G) sub-wire grating and a blue (B) sub-wire grating by a patterning process;
   coating a metal film on the base substrate to form a red (R) sub-grating, a green (G) sub-grating and a blue (B) sub-grating parallel with one another, wherein in each sub-grating, the metal film comprises a lower metal layer formed in an opening area for diffraction therein and an upper metal layer formed in a reflective region around the opening area, the lower and upper metal layers being made of same material; and
   forming a reflective film on the upper metal layer by a patterning process.

2. The method according to claim 1, wherein forming the reflective film which overlays the upper metal layer comprises:
   depositing a reflective film on the upper metal layer;
   spinning coating a photoresist film on the reflective film; and
   exposing the opening area of each sub-grating by performing an exposure, developing and etching processes to the base substrate and then removing the remaining photoresist on the base substrate.

3. The method according to claim 2, wherein before spinning coating the photoresist film on the reflective film, the method further comprises:
   stamping the reflective film by a mold with prism patterns to form a prism type reflective film.

4. The method according to claim 1, wherein the base substrate is a transparent substrate, an opposing substrate or an array substrate during the depositing the silicon nitride film on the base substrate.

5. The method according to claim 4, wherein a transparent conductive film is formed on the opposing substrate.

6. The method according to claim 4, wherein if the base substrate is the array substrate, the method further comprises depositing a transparent conductive film on the array substrate before depositing the silicon nitride film on the base substrate.

7. The method according to claim 1, wherein
   R sub-grating comprises: $l=0.813$ um, $\Phi=20\%$, $t=80$ nm, $d=20$ nm;
   G sub-grating comprises: $l=0.813$ um, $\Phi=36\%$, $t=60$ nm, $d=40$ nm; and
   B sub-grating comprises: $l=0.813$ um, $\Phi=47\%$, $t=40$ nm, $d=60$ nm;
   wherein "l" is a period length of each sub-grating, $\Phi$ is a duty cycle and $\Phi=w/l$, "w" is an opening width of each sub-grating opening area, "t" is a thickness of the lower metal layer for diffraction on the sub-grating, and "d" is an interval between the opening area and the reflective region.

8. The method according to claim 1, wherein,
   a thickness of the lower metal layer of the R sub-gratings is in the range of 75~85 nm;
   a thickness of the lower metal layer of the G sub-gratings is in the range of 55~65 nm; and
   a thickness of the lower metal layer of the B sub-gratings is in the range of 35~45 nm.

9. A method for manufacturing a liquid crystal display panel, comprising:
   forming an opposing substrate with only a transparent conductive film deposited thereon;
   forming an array substrate on which a data line and a gate line are crosses with each other and define a pixel unit;
   forming the grating sheet by the method according to claim 1, wherein the grating sheet is formed on a glass substrate, the array substrate or the opposing substrate; and
   attaching the array substrate and the grating sheet or attaching the opposing substrate and the grating sheet when the grating sheet is formed on the glass substrate; or attaching the array substrate and the opposing substrate when the grating sheet is formed on the array substrate or the opposing substrate.

* * * * *